(12) United States Patent
Clinton

(10) Patent No.: US 7,733,686 B2
(45) Date of Patent: Jun. 8, 2010

(54) PULSE WIDTH CONTROL FOR READ AND WRITE ASSIST FOR SRAM CIRCUITS

(75) Inventor: Michael Patrick Clinton, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/965,604

(22) Filed: Dec. 27, 2007

(65) Prior Publication Data

US 2008/0181033 A1  Jul. 31, 2008

Related U.S. Application Data

(60) Provisional application No. 60/882,915, filed on Dec. 30, 2006.

(51) Int. Cl.
*G11C 7/00* (2006.01)

(52) U.S. Cl. ........................ 365/154; 365/194

(58) Field of Classification Search ............... 365/154, 365/194
See application file for complete search history.

(56) References Cited

U.S. PATENT DOCUMENTS

| | | | | |
|---|---|---|---|---|
| 5,546,354 | A * | 8/1996 | Partovi et al. | 365/233.1 |
| 6,819,512 | B2 * | 11/2004 | Kirby | 360/29 |
| 6,856,574 | B2 * | 2/2005 | Iwahashi et al. | 365/233.16 |
| 2004/0032769 | A1 * | 2/2004 | Takahashi et al. | 365/200 |
| 2004/0105339 | A1 * | 6/2004 | Iwahashi et al. | 365/233 |
| 2005/0128855 | A1 * | 6/2005 | Joshi et al. | 365/230.06 |
| 2005/0169051 | A1 * | 8/2005 | Khalid et al. | 365/185.03 |

* cited by examiner

*Primary Examiner*—Michael T Tran
(74) *Attorney, Agent, or Firm*—Dawn V. Stephens; Wade James Brady, III; Frederick J. Telecky, Jr.

(57) ABSTRACT

An exemplary system and methods implementing pulse width control in SRAM bit cell arrays that vary in size are described.

20 Claims, 2 Drawing Sheets

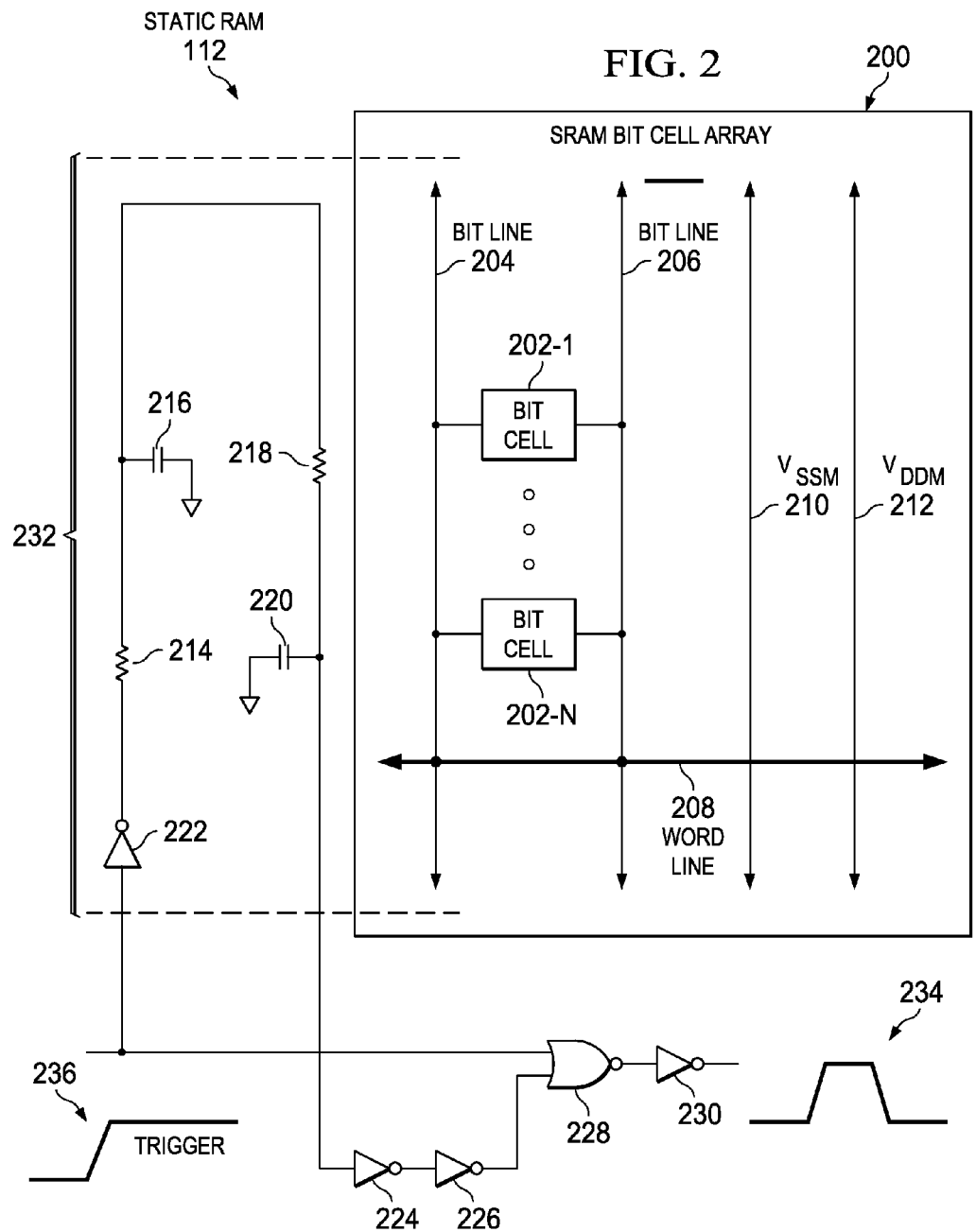

1

PULSE WIDTH CONTROL FOR READ AND WRITE ASSIST FOR SRAM CIRCUITS

RELATED APPLICATIONS

The present application claims priority under 35 U.S.C. §119(e) to U.S. Provisional Application No. 60/882,915 filed Dec. 30, 2006, the disclosure of which is incorporated herein.

BACKGROUND

Portable electronic devices, such as cellular devices, include processors or compilers, and compiler memory which can include static random access memory or SRAM. Since it is a continuous goal to make electronic devices smaller, it becomes a goal to make SRAM devices smaller. The industry has characterized size for devices such as SRAM as to contact size, particular examples are larger "65 nm" technology, smaller "45 nm" technology, and even smaller "32 nm" technology. It is expected that sizes will further evolve (grow smaller) from "32 nm" technology.

As SRAM devices decrease in size, certain problems are presented. One such problem is the ability to efficiently read from and write to SRAM devices, and particularly reading from and writing to memory or bit cells of SRAM devices. SRAM bit cells are typically arranged in an array (or arrays) with columns and rows of bit cells. As SRAM become smaller, there may be a need to provide read and write assist circuits to make such higher density bit cells work.

Such read and write assist circuits may require charging or discharging of power rails and/or signals such as bit lines, which run in the column dimension. Tight tolerances may be required to support moving and controlling a change in voltage (i.e., delta V) of these power rails and/or bit lines. A particular problem arises as to how a pulse can be generated to move these power rails and/or bit lines a fixed delta V when the capacitance of the bit lines varies as the number of rows of bit cells along the bit line increase or decreases. This is the case when SRAM is used as compiler memory, where the number of word lines which determine bit line length varies. For example, in one application there may be eight word lines that translate to a relatively short bit line, and in another application there may be 256 word lines that translate to a relatively longer bit line length.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In an embodiment, a static random access memory (SRAM) device the bit cells arranged in rows in a bit cell array. A tracking circuit that follows the rows and particularly a bit line that connects the cells, receives a trigger edge and introduces a delay to the trigger edge, such that a pulse width is based on the length of a bit line.

BRIEF DESCRIPTION OF THE CONTENTS

FIG. 2 is a block diagram illustrating an exemplary SRAM with a tracking circuit that outputs a varying pulse width based on bit line length.

DETAILED DESCRIPTION

An exemplary system and methods for implementing pulse width control in SRAM bit cell arrays that vary in size are described. The exemplary system and methods include tracking bit line length of a SRAM bit cell array, and determining a pulse width based on the bit line length. The system and methods may be included in or part of a portable electronic device, for example a wireless communication device, such as a cellular telephone.

In a particular implementation, a delay through a tracking circuit, is controlled between word line activation and setting of a sense amp based on the number of rows and columns in a bit cell array of a SRAM device. The tracking circuit allows modifying the delay automatically as the number of rows and columns changes. A similar technique may be implemented based on bit line length only, to control the pulse width of control signals for column based read and write assist circuits such as lower bit line precharge, raised $V_{SSM}$, and lowered $V_{DDM}$. The pulse width can be started and based on a trigger signal, and the pulse width determined by some programmable delay, which includes a bit line length tracking element.

Methods of creating the bit line length tracking delay include transmitting a signal across a "dummy" bit line; or transmitting a signal across a dummy wire whose length tracks the length of the bit line. In addition to the length tracking, a "dummy" device loading may be included to mimic the device loading along the true power rail or signal line being tracked. Bit lines of different lengths may be supported for an area efficient compiler SRAM memory.

Figure 1:
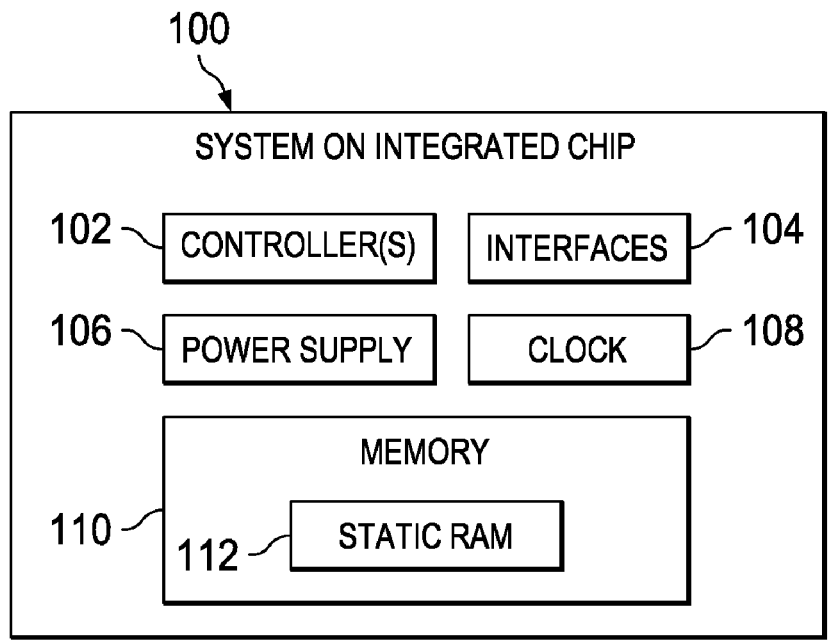
FIG. 1 is a block diagram illustrating an exemplary system that supports tunable voltage for a SRAM memory device.

FIG. 1 shows an exemplary system 100. In this example, system 100 is a system on an integrated chip or SOIC. Although, the system 100 is discussed in reference to distinct blocks or components, it is to be appreciated that other implementations may combine such components or functions of such components, rely on functionality from other components (either internal or external to system 100), forego particular components and/or functionality, and so on.

System 100 includes one or more processors or controller (s) 102. Controller(s) 102 may implement a feedback and control system, and to particularly monitor control the pulse width of control signals for column based read and write assist circuits such as lower bit line precharge, raised $V_{SSM}$, and lowered $V_{DDM}$. Controller(s) 102 may include intelligent and adaptive hardware and software techniques that dynamically control voltage, frequency, and power based on device activity, modes of operation and temperature. Furthermore, controller(s) 102 are coupled to and may be configured to monitor and provide intra and inter communications, and to regulate power in the system 100. Interfaces 104 may be provided to support such communications. Interfaces 104 may include various communication input/output interfaces and communication busses or lines.

In this implementation, exemplary system 100 includes a power supply 106 which may be a component that receives power from an external source and stores the power to be used by system 100. Power supply 106 can include a regulated voltage or current supply. The system 100 can include a clock 108 used for various timing operations by system 100.

System 100 includes a memory component or memory 100. Memory 100 can include volatile and non volatile memory, such as ROM and RAM memory. Memory 100 is particularly accessed and controlled by controller(s) 102, and interfaces with other components in system 100. In particular, memory 110 receives power from power supply 106, communicates with or through interfaces 106, and receives clock or timing signals from clock 108. Memory 100 includes a static random access memory (SRAM) device or component, hereinafter referred to as SRAM 112. SRAM 112 may be configured as an array of bit cells. SRAM 112 may implement a particular size technology (e.g., "45 nm", "32 nm", etc.).

FIG. 2 shows an SRAM with a tracking circuit that provides a determined pulse width based on the length of bit lines. In this example, SRAM 112 includes a bit cell array 200 that is made up of multiple bit cells 202-1 to 202-N. Although shown as a single column arrangement, it is to be appreciated that bit cells 202 can extend across the rows. In other words, there may be multiple columns of bit cells 202, although only one column is shown in the example.

The example shows bit cells 202 connected to a bit line 204 and a complementary "bar" or "not" bit line, or bit line bar 206. A word line 208 is connected to bit line 204 and bit line bar 206. Although a single bit line 204, a single bit line bar 206, and a single word line 208 are shown, it is contemplated that multiple bit lines (and complementary bit lines or bit line bars) may be implemented depending on the number of columns in the bit cell array 200. Likewise, multiple word lines may be implemented based on the number of rows in the bit cell array 200.

Power rails $V_{SSM}$ 210 and $V_{DDM}$ 212 are connected to bit line 204, bit line bar 206, and word line 208. The power rails $V_{SSM}$ 210 and $V_{DDM}$ 212 may be adjusted, as further described below.

SRAM 112 includes an RC tracking circuit that is made up of a resistor 214 and capacitor 216 that make up an RC pair, and another resistor 218 and capacitor 220 that make up another RC pair. The RC tracking circuit further includes inverters 222, 224, and 226 that are used to introduce delay in the RC tracking circuit. The RC tracking circuit further includes a NAND gate 228 and an inverter 230. The RC tracking circuit particularly follows the length of bit line 204 and bit line bar 206 as represented by 232. In other words, the RC tracking circuit is approximately the same length going up and coming back along the bit line 204 (and bit line bar 206), as bit line 204 (and bit line bar 206).

The NAND gate 228 receives the trigger or pulse 236, directly as one input and a delayed version of the trigger or pulse 236, inverted an odd number of times (e.g., three in this example circuit) and generates a pulse, whose width is equal to the delay between the two edges, the first edge being the rising trigger pulse, and the second edge being the delayed and inverted/falling edge. Therefore, the edge can determine the final pulse width 234. In other words, the start of the generated pulse 236 is begun by the trigger, and the width of the generated pulse 234 is determined by the delay of the leading edge of the trigger through the delay circuit.

It is to be noted that the clock/trigger edge or pulse sent through the delay circuit can be inverted, as in this example, or clock/trigger edge or pulse can be the same phase as the clock/trigger or pulse 236. In this example, the total number of inversions is an odd number.

An example of a pulse generator circuit is illustrated, where a NAND 228 with a direct trigger input and an inverted trigger input are implemented; however, it is to be appreciated that other possible pulse generator circuits may be implemented, such as a NOR gate where the trigger input is a low going signal and the other input is a delayed inversion of the low going trigger input. Regardless of implementation, bit-line length is used in tracking to determine the pulse width.

In an implementation, SRAM 112 is used as compiler memory. Depending on application or compiler use, SRAM bit cell array 200 can vary, and in particular bit line 204 and bit line bar 206 can vary. The RC tracking circuit (length 232) also varies with the length of bit line 204 and bit line bar 206, as the SRAM bit cell array 200 varies over an allowable range. As RC tracking circuit length 232 varies, RC tracking circuit tracks the bit line length (i.e., bit line 204 and bit line bar 206). In particular, a pulse width 234 is varied using the RC tracking circuit.

There are various known methods for read or write assist, which supports stability (read) or write-ablity to a SRAM bit cell (e.g., bit cells 202). In an implementation, one or more of these methods may be implemented for SRAM 112. In general, for either a read or write assist circuit, a trigger or pulse 236 is generated. For the original signal or pulse 236 coming in to the RC tracking circuit, is delayed through the RC tracking circuit, and particularly the three inverters 222, 224, and 226. The period of time that the original signal or pulse 236 is delayed equals the pulse width 234. The pulse 236 may be a clock or trigger EDGE.

In a read operation to a bit cell 202, pulse 236 is generated to lower bit line 204 voltage level. In a SRAM device, such as SRAM 112, bit lines (e.g., bit line 204) are prechareged to a full $V_{DDM}$ 212 level when the word line 208 is turned "on" for read access. Any bit line precharge devices (not shown) are turned off, where the bit line precharge devices connect bit lines (e.g., bit line 204) to $V_{DDM}$ 212. Therefore, this leaves the bit lines (e.g., bit line 204) floating. The word line 208 is then turned "on". Bit lines (e.g., bit line 204) through pass gates use a low node in the bit cell 202, and will start to discharge through the pass gate and low node, and a signal will develop between bit line 204 and bit line bar 206. The signal may be sensed by a sense amp (not shown). In other words, the sense amp looks at a generated differential between bit line 204 and bit lines bar 206.

Using the example of a read assist, a pulse 236 is generated, when word line 208 is turned "on". Bit line 204 may be started a few hundred millivolts below $V_{DDM}$ 212. Voltage at bit line 204 typically begins at the voltage at $V_{DDM}$ 212. By having bit line 204 pulsed to a lower level prior to turning on word line 208, an improvement in stability may be seen at bit cell 202 for read assist. Therefore, the pulse width 234 that may be required to reduce the bit line 204 voltage is directly related to the length of the bit line 204 and capacitance of the bit line 204, and amount of charge to be pulled off of the bit line 204. By tracking the pulse 236, a more accurate determination may be made as to how far a precharge level may be made for bit line 204.

Therefore, the bit line 204 length 232 is automatically tracked using the pulse 236 and the RC tracking circuit, and greater control may be achieved as to how far the bit line 204 precharge level may be pulsed down.

Likewise for write assist, $V_{DDM}$ 212 may be reduced below a word line 208 level, making a bit cell 202 very unstable and easier to write, when word line 208 is turned "on". Examples of a write assist include raising $V_{SSM}$ 210, where $V_{SSM}$ 210 is unique to column or proportional to bit line length 232. Therefore for read assist, the pulse width 224 is used to adjust for bit line 204 precharge, pulling down on bit line voltage. For write assist, instead of pulling down on bit line 204 voltage, pull down is performed on $V_{DDM}$ 212.

If pulse 236 that tracks the length 232 of the bit line 204, $V_{DDM}$ 212 is unique to the column (i.e., bit line 204), then the amount of charge to be pulled off of the bit line 204, would be proportional to the bit line length 232. Therefore, the pulse width 234 is not fixed, but varies with the bit line length 232.

For a relatively short bit line 204, the RC tracking circuit would be negligible and pulse width 234 relatively narrow. For a longer bit line 204, the RC tracking circuit results in a greater pulse width 234.

Figure 3:
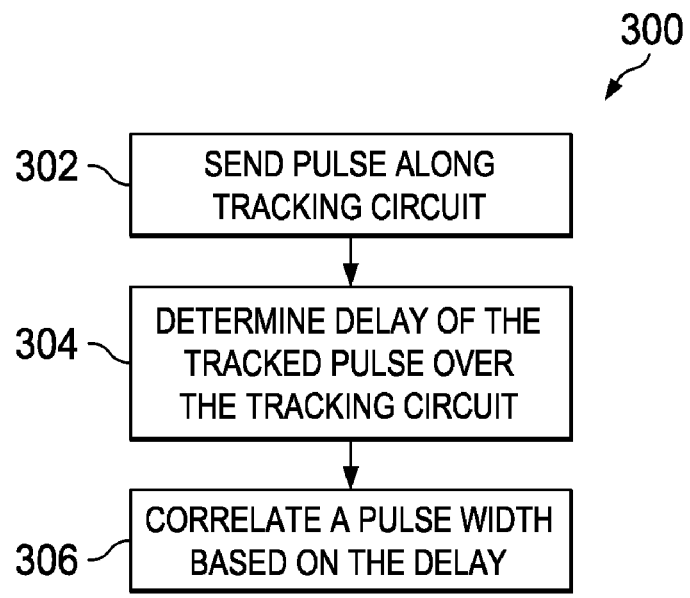
FIG. 3 is a flowchart illustrating a process to support providing a pulse width for a particular bit cell array size for a SRAM memory device.

FIG. 3 shows a process 300 that provides for tracking and controlling a pulse width in support of read or write operations to bit cells in a SRAM device. The process 300 is illustrated as a collection of blocks in a logical flow graph, which represent a sequence of operations that can be implemented in hardware such as described above. Although described as a flowchart, it is contemplated that certain blocks may take place concurrently or in a different order.

At block 302, a pulse is sent along a tracking circuit. The pulse may be a known or generated pulse, such as a pulse from a read or write assist circuit. The pulse is considered a trigger, where the pulse's edge is measured. For example, the time at the pulse's rising edge is measured.

At block 304, a delay is introduced on the tracking circuit. In particular the delay affects the pulse or trigger/edge that is sent. The delay is proportional to the length of the tracking circuit which in turn follows a bit line connected to bit cells in a bit array. The bit line determines the delay.

At block 306, a pulse width is correlated to the delay. In particular, this pulse width is proportional to the bit line, since the pulse width is correlated to the delay.

CONCLUSION

The above-described systems and methods to track and control a pulse width for bit cells in a SRAM device. Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A system comprising:
   a controller that monitors and controls pulse width of control signals for read and write assist for bit cells; and
   a memory coupled to the controller, comprised of:
      a static random access memory (SRAM) device that includes the bit cells, and
      a tracking circuit operative for controlling voltage levels of the SRAM device that receives a pulse and introduces a delay to the pulse such that the a final pulse width is based on a length of a bit line connected to the bit cells and the final pulse width is used in controlling voltage levels for the SRAM device.

2. The system of claim 1, wherein controller adjusts one of precharge to the bit line, raised $V_{SSM}$ to the bit cells, or lowered $V_{DDM}$ to the bit cells.

3. The system of claim 1, wherein the length of the delay is modified based on a number of rows of a bit cell array that includes the bit cells.

4. The system of claim 1, wherein the controller controls power provided to the SRAM device.

5. The system of claim 1, wherein a length of the tracking circuit is approximately equal a length the bit line.

6. The system of claim 1, wherein the SRAM device is compiler memory.

7. The system of claim 1, wherein the bit cells are in a bit array that can vary in rows and columns.

8. The system of claim 1 implemented in a portable electronic device.

9. A static random access memory (SRAM) device comprising:
   a tracking circuit operative for controlling voltage levels of the SRAM device in response to receiving a known pulse, the tracking circuit comprising RC circuits and inverters; and
   an array of bit cells that are connected to one or more bit lines, wherein the tracking circuit receives the known pulse and introduces a delay such that a final pulse width for a final pulse is generated based on the delay, and the final pulse width is used in controlling voltage levels for the SRAM device.

10. The SRAM device of claim 8, wherein the tracking circuit extends along a length associated with the bit lines.

11. The SRAM device of claim 8, wherein the length of the bit cells determines the delay.

12. The SRAM device of claim 8, wherein the length of the delay is modified based on a number of rows of the array.

13. The SRAM device of claim 8, wherein one of the following are adjusted: precharge to the bit lines, raised $V_{SSM}$ to the bit cells, or lowered $V_{DDM}$ to the bit cells.

14. The SRAM device of claim 8, wherein the pulse is a trigger edge.

15. The SRAM device of claim 8, wherein the array varies in rows and columns.

16. The SRAM device of claim 8 implemented as compiler memory.

17. The SRAM device of claim 8 implemented in a portable electronic device.

18. A memory device comprising:
   a plurality of bit lines having an associated bit line length;
   a read and write assist circuit positioned along at least one of the plurality of bit lines, the read and write assist circuit comprising:
      an input for receiving a first pulse;
      a first inverter coupled to the input;
      first and second series connected RC pairs, the first series connected RC pair coupled to the first inverter;
      second and third series connected inverters, the second series connected inverter coupled to the second series connected RC pair;
      a NAND gate coupled to the input and the second series connected inverter; and
      a fourth inverter coupled to the NAND device,
   wherein the a read and write assist circuit produces a final pulse having a final pulse width associated with a delay in the read and write assist circuit.

19. The memory device of claim 18, wherein the final pulse width is used in reducing a voltage associated with one of the bit lines in the plurality of bit lines.

20. The memory device of claim 18, wherein the read and write assist circuit determines how far a precharge level may be made for one of the bit lines in the plurality of bit lines.

* * * * *